United States Patent [19]

Stein et al.

[11] 4,055,837

[45] Oct. 25, 1977

[54] DYNAMIC SINGLE-TRANSISTOR MEMORY ELEMENT FOR RELATIVELY PERMANENT MEMORIES

[75] Inventors: Karl-Ulrich Stein, Munich; Karlheinrich Horninger, Eglharting, both of Germany

[73] Assignee: Siemens Aktiengesellschaft, Berlin and Munich, Germany

[21] Appl. No.: 624,710

[22] Filed: Oct. 22, 1975

[30] Foreign Application Priority Data

Oct. 22, 1974 Germany .............................. 2450116

[51] Int. Cl.² .............................................. G11C 11/40
[52] U.S. Cl. ........................ 340/173 R; 340/173 CA; 307/238
[58] Field of Search .................... 340/173 R, 173 CA; 307/238, 279

[56] References Cited

U.S. PATENT DOCUMENTS 3,855,581  12/1974  Greene ........................... 340/173 CA Primary Examiner—Terrell W. Fears
Attorney, Agent, or Firm—Hill, Gross, Simpson, Van Santen, Steadman, Chiara & Simpson

[57] ABSTRACT

The invention relates to a dynamic single-transistor memory element whereby the information may be stored for long periods of time without an energy supply. The invention also provides for a dynamic single-transistor memory element having the capability of storing two differing information pulses. The write-in process may be effectuated element-wise, line-wise, or matrix-wise. The invention further provides the capability to effectuate the erasure of the information line by line where the information is intermedially stored in the regenerator amplifiers or matrix by matrix where the intermediate storage occurs in the second matrix.

23 Claims, 3 Drawing Figures

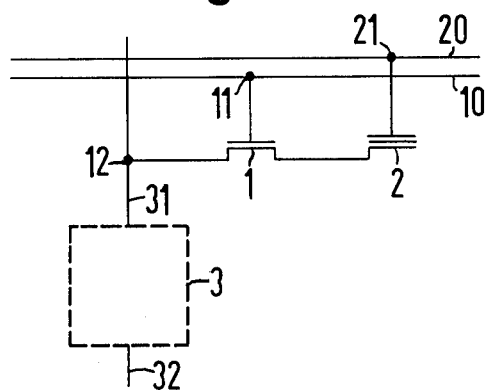
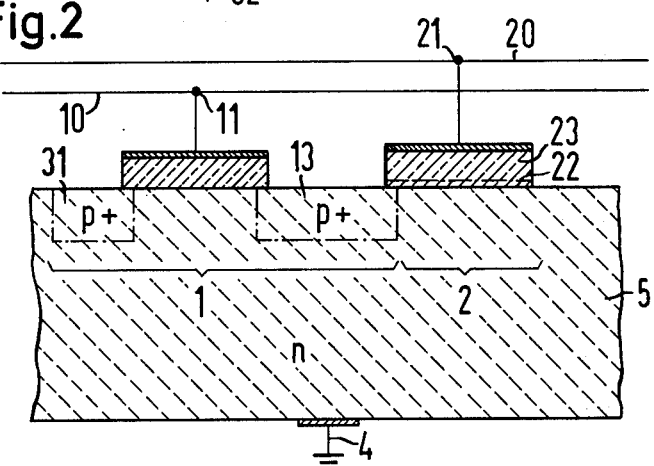
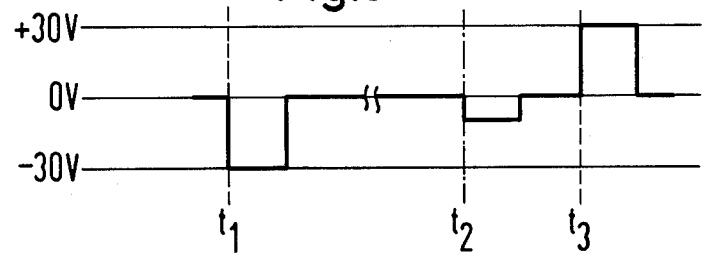

DYNAMIC SINGLE-TRANSISTOR MEMORY ELEMENT FOR RELATIVELY PERMANENT MEMORIES

BACKGROUND OF THE INVENTION

Field of the Invention

Dynamic single-transistor memory elements allow for the storage of and regeneration of requisite information for purposes of utility in connected selective circuitry. Generally, the dynamic single-transistor memory elements comprise a transistor generally connected to a bit line and a corresponding word line, and a capacitor connected in series thereto.

Prior Art

Dynamic single-transistor memory elements are known to the art. A single transistor memory element has, for instance, been described in the U.S. Pat. No. 3,774,176, comprising a capacitor and a field-effect transistor. In order to read the information from a single-transistor memory element, the transistor of this memory element is switch connected to a bit line and with a capacitor via its gate terminal which in turn is connected with a selective circuit. In operation, this connection causes the information stored in the capacitor in the form of a charge to flow towards the bit line via the selected field-effect transistor.

A drawback of such a single-transistor memory element is given in the fact that the stored information must be recycled in interavals of approximately 1 to 100 msec. A further drawback results in that, when the supply voltage is switched off, the information stored in a single-transistor memory element is destroyed.

SUMMARY OF THE INVENTION

The object of the present invention is to provide a single-transistor memory element to store the incident information for long periods of time. The invention further provides for the simultaneous storage of two different information pulses in a single-transistor memory element.

The object of the invention is realized by an improved single-transistor memory element comprising a transistor connected to a bit line and corresponding word line via the gate terminal and a capacitor connected in series thereto.

Another advantage of the single-transistor memory element in accordance with the invention results in that the stored information can be stored over a period of time up to ten years without energy supply.

Also, the write-in process may be effectuated element-wise, line-wise, or matrix-wise. The invention further provides the capability to effectuate the erasure of the information line by line where the information is intermedially stored in the regeneration amplers, or matrix by matrix where the intermediate storage occurs in the second matrix.

BRIEF DESCRIPTION OF THE DRAWINGS

FIG. 1 depicts a schematic diagram of a dynamic single-transistor memory element in accordance with the invention.

FIG. 2 is a diagrammatic cross-sectional view through a single-transistor memory element in accordance with the invention.

FIG. 3 diagrammatically depicts a pulse program for a circuit in accordance with the invention.

DESCRIPTION OF THE PREFERRED EMBODIMENT

A single-transistor memory element, as best seen in FIG. 1, comprises a transistor 1 and a capacitor means 2 connected in series. The transistor 1 is a MOS field-effect transistor. The capacitor means 2 comprises a capacitor whose dielectric comprises rechargeable states; being a MNOS capacitor. A drain connection of the MOS field-effect transistor 1 is connected with a bit line 31 and an evaluator circuit 3 at point 12. The latter is further serially connected via a bit line 32 with single-transistor memory elements not shown in the figure. A gate terminal of the transitor 1 can be controlled via a word line 10. For this reason, the gate terminal is connected with said word line at point 11. An electrode of the MNOS capacitor 2, which is not connected with a source terminal 13 of the transistor 1 (as best seen at FIG. 2), is electrically connected with a write line 20 at pont 21. The write lines of all elements of a memory matrix may be galvanically interconnected.

A substrate upon which the single-transistor memory element has been sonstructed is denoted by 5 at FIG. 2. Preferably, this substrate consists of n-silicon. Said substrate 5 preferably rests on a mass potential at point 4. The transistor 1 and the capacitor 2 are arranged upon the substrate 5. A $p^+$ doped area 31 located within said substrate 5 simultaneously comprises a drain terminal of the transistor 1 and the bit line. A $p^{3+}$ doped source area 13 of the transistor 1 provides the connection to said capacitor 2. Said capacitor is advantageously a MNOS capacitor whose dielectric comprises an $SiO_2$ layer 22 and $Si_3N_4$ layer 23. The thickness of the $SiO_2$ layers is on the order of 1 to 3 nm and the thickness of the $Si_3N_4$ layers is in the order of 30 to 60 nm.

Two functional modes of the single-transistor memory element in accordance with the invention and with FIGS. 1 and 2 are explained below.

The first functional mode is explained in connection with FIG. 3 wherein the potentials on the write line 20 are shown. If, for instance, an information "1" is written into the capacitor via the bit line 31 and via the transistor 1, then the transistor 1 is first placed into the conductive state via the word line 10 for this reason. The potential at an electrode 13 of the MNOS capacitor connected with the transistor 1, will be approximately −15 V in the case of the application of a p-channel transistor as transistor 1. If a write voltage of approximately −30 V is applied to the write line 20 (instant $t_1$), an inversion layer will form below the MNOS capacitor having a potential of −15 V. The states ('traps') of the capacitor are unable to recharge themselves, and thus the flat-band voltage of the MNOS capacitor 2 cannot change since the resulting potential at the gate insulator of the MNOS capacitor 2 is only approximately 15 V, whereas approximately 30 V would be required for the change to occur. This potential results from the two potentials applied to the electrodes of the capacitor.

If, however, an information "0" is written via the bit line 31 and the transistor 1 which is conductively controlled via the word line 10, the potential at the electrode 13 of the MNOS capacitor 2, which is connected with the transistor 1, will be approximately 0 volt. The write voltage applied to the write line 20 of approximately −30 volts is now fully effective at the gate insulator. This means that the states ('traps') of the MNOS capacitor are recharged and that the flat-band voltage of the capacitor is shifted.

If a read voltage of, for instance −8 V is applied to the capacitor 2 via the check with rate write line 20 (instant $t_2$), then an inversion layer will form at the silicon surface in the case when the information "1" is stored in the capacitor. However, if the information "0" is stored in the capacitor 2, then only a depletion layer is present at the silicon surface of the MNOS capacitor 2. The evaluation of these two states is effectuated, as it is generally known in connection with single-transistor memory elements, with the help of an evaluator flip-flop. The evaluator flipflop as seen at FIG. 1 not shown in detail, is denoted by 3.

If the information stored in the MNOS capacitance 2 is to be erased, then a positive voltage pulse of a magnitude of approximately +30 V and a duration of approximately $10\mu$ sec is applied to the write line 20. This corresponds to the instant $t_3$ in FIG. 3.

In the case of a second functional mode of the memory element in accordance with this invention, the element is written in and read out at the write line 20 as a common single-transistor memory element with an inversion layer capacitor, for the operation with given voltages, in particular, −15 V. If the data contained in the memory is to be stored for a very long time, prior to the switching off of the current supply, the information containedin the element is written into the MNOS capacitor by way of corresponding voltage pulse at the write line 20. Herefore, as described hereinabove, a −30 V is applied to drive line 20. The surface potential of the inversion layer will be 0 V in the elements wherein a "0" has been written. Thus, a reloading of the states in the dielectric of the memory capacitor will be effected causing a prospective shift in the flat-band voltage. In the elements wherein a "1" has been written, the surface potential has a negative value, for instance, −15V. The voltage of approximately −30 V, applied at the write line, does not cause a shifting of the flat-band voltage. This writing-in into the more permanent memory state may be effected element-by-element, line-by-line or matrix-by-matrix.

Two versions of read-out are possible. In the case of the first one, the voltage at the write line is selected sufficiently large so an inversion layer forms only in the elements wherein the states are not recharged.

The second method of read-out, which is essentially faster, consists in that the voltage of −15 V, which is common to the single-transistor memory elements, is applied to the line 20 for recovering the information, and another voltage, also of approximately −15 V, applied at the bit line 31 is then applied to the inversion layer via the selective transistor 1. The surface potential of the inversion layer of the memory capacitor 2 will then be approximately −15 V in the case of neutral states, and in the case of recharged states, it will be higher, aproximating the value of the shifting of the flat-band voltage (−8 V). This different surface potential may now again be read-out and regenerated in the manner common with single-transistor elements.

After the regenerator, read-out of the invention which has been stored more permanently in the MNOS capacitor, the MNOS capacitors must be erased for the preparation of a next possible write-in process for more permanent storage. This erasure may be effected word-by-word via the write line extending parallel to the word line wherein said write line carried a potential of +30 V. Information may thereby be intermediately stored in the read regenerator amplifier.

Another possibility is given in the matrix-by-matrix erasure which has the advantage that all write lines may be galvanically interconnected, and only a connection towards outside of the chip is required for a matrix. The information stored in matrix, however, must be immediately stored in another matrix, for instance, upon another chip.

The described second functional mode with the usual operation of the single-transistor memory element and the special write-in and read-out of the permanent memories offers as a particular advantage, the same high speed as the common dynamic semiconductor memories, in addition to the relative permanency of the MNOS arrangement. The demand on the dielectric memory capacitor 2 for the more permanent information is thereby substantially less than in the case of usual common electrically programmable memories; thus, such a sharp limitation of the reading processes or writing processes is not to be anticipated as in the case of prior art electrically programmable memories.

A further advantage of the memory element in accordance with the invention is also given in the smaller space requirement per memory element.

Where n-channel MOS transistors are used as transistors 1, potentials of opposite polarity are used in a corresponding manner.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims. We claim:

1. Dynamic single-transistor memory element connected to a word line and a bit line comprising:
    a transistor having at least two terminals and a gate terminal, connected at one of said terminals with said bit line and at said gate terminal with said word line;
    a capacitor having at least two electrodes connected at one of said electrodes in series to one of said two terminals of said transistor;
    wherein said single-transistor memory element comprises a write line, said capacitor is a metal dielectric semiconductor capacitor, said dielectric comprises a pluraliy of selective activation states and said electrode which is not connected with said transistor is connected with said write line.

2. Dynamic single-transistor memory element connected to a word linc and a bit line comprising:
    a transistor having at least two terminals and a gate terminal, connected at one of said terminals with said bit line and at said gate terminal with said word line;
    a capacitor having at least two electrodes connected at one of said electrodes in series to one of said two terminals of said transistor;
    wherein said single-transistor memory element comprises a write line, said capacitor is a metal dielectric semiconductor capacitor, said dielectric comprises a plurality of selective activation states and said electrode which is not connected with said transistor is connected with said write line; and said transistor comprises a MOS field-effect transistor.

3. Dynamic single-transistor memory element connected to a word line and a bit line comprising:
   a transistor having at least two terminals and a gate terminal, connected at one of said terminals with said bit line and at said gate terminal with said word line;
   a capacitor having at least two electrodes connected at one of said electrodes in series to one of said two terminals of said transistor;
   wherein said single-transistor memory element comprises a write line, said capacitor is a metal dielectric semiconductor capacitor, said dielectric comprises a plurality of selective activation states and said electrode which is not connected with said transistor is connected with said write line;
   said transistor comprises a MOS field-effect transistor; and
   said dielectric of said capacitor comprises two insulator layers.

4. Dynamic single-transistor memory element connected to a word line and a bit line comprising:
   a transistor having at least two terminals and a gate terminal, connected at one of said terminals with said bit line and at said gate terminal with said word line;
   a capacitor having at least two electrodes connected at one of said electrodes in series to one of said two terminals of said transistor;
   wherein said single-transistor memory element comprises a write line, said capacitor is a metal dielectric semiconductor capacitor, said dielectric comprises a plurality of selective activation states and said electrode which is not connected with said transistor is connected with said write line;
   said transistor comprises a MOS field-effect transistor; and
   said capacitor is a MNOS capacitor having a dielectric comprising an $SiO_2$ layer and an $Si_3N_4$ layer.

5. Dynamic single-transistor memory element connected to a word line and a bit line comprising:
   a transistor having at least two terminals and a gate terminal, connected at one of said terminals with said bit line and at said gate terminal with said word line;
   a capacitor having at least two electrodes connected at one of said electrodes in series to one of said two terminals of said transistor;
   wherein said single-transistor memory element comprises a write line, said capacitor is a metal dielectric semiconductor capacitor, said dielectric comprises a plurality of selective activation states and said electrode which is not connected with said transistor is connected with said write line;
   said transistor comprises a MOS field-effect transistor;
   said capacitor is a MNOS capacitor having a dielectric comprising an $SiO_1$ layer and an $Si_3N_4$ layer; and said $SiO_2$ layer has a thickness of 1 through 3 nm.

6. Dynamic single-transistor memory element connected to a word line and a bit line comprising:
   a transistor having at least two terminals and a gate terminal, connected at one of said terminals with said bit line and at said gate terminal with said word line;
   a capacitor having at least two electrodes connected at one of said electrodes in series to one of said two terminals of said transistor;
   wherein said single-transistor memory element comprises a write line, said capacitor is a metal dielectric semiconductor capacitor, said dielectric comprises a plurality of selective activation states and said electrode which is not connected with said transistor is connected with said write line;
   said transistor comprises a MOS field-effect transistor; and
   said capacitor is a MNOS capacitor having a dielectric comprising an $SiO_2$ layer having a thickness of 1 to 3 nm and an $SiN_4$ layer having a thickness of 40 to 60 nm.

7. Dynamic single-transistor memory element as defined in claim 1, wherein the write line is galvanically connected with the write lines of the respective elements.

8. Dynamic single-transistor memory element as defined in claim 1, wherein the write line is galvanically connected with the write lines of different group elements of a memory matrix combined in groups.

9. Dynamic single-transistor memory element as defined in claim 2, wherein the write line is galvanically connected with the write lines of the respective elements.

10. Dynamic single-transistor memory element as defined in claim 2, wherein the write line is galvanically connected with the write lines of different group elements of a memory matrix combined in groups.

11. Dynamic single-transistor memory element as defined in claim 3, wherein the write line is galvanically connected with the write lines of the respective elements.

12. Dynamic single-transistor memory element as defined in claim 3, wherein the write line is galvanicaly connected with the write lines of different group elements of a memory matrix combined in groups.

13. Dynamic single-transistor memory element as defined in claim 4, wherein the write line is galvanically connected with the write lines of the respective elements.

14. Dynamic single-transistor memory element as defined in claim 4, wherein the write line is galvanically connected with the write lines of different group elements of a memory matrix combined in groups.

15. Dynamic single-transistor memory element as defined in claim 5, wherein the write line is galvanically connected with the write lines of the respective elements.

16. Dynamic single-transistor memory element as defined in claim 5, wherein the write line is galvanically connected with the write lines of different group elements of a memory matrix combined in groups.

17. Dynamic single-transistor memory element as defined in claim 6, wherein the write line is galvanically connected with the write lines of the respective elements.

18. Dynamic single-transistor memory element as defined in claim 6, wherein the write line is galvanically connected with the write lines of different group elements of a memory matrix combined in groups.

19. In a single-transistor memory element connected to a word line and a bit line and comprising a write line, a transistor, and a capacitor having a silicon surface, connected in series thereto, a method of:

switch connecting said transistor for writing-in information via the word line;

applying a negative voltage to said write line for writing-in information through said bit line while using a p-channel transistor as said transistor, such that a flat-band voltage of said capacitor remains constant during storage of information "1" in the memory element and such that said flat-band voltage of said capacitor is sifted (instant $t_1$) during storage of information "0" in said memory element;

applying a negative read voltage to said capacitor for reading out information through said write line, said read voltage being referenced so that in a case of said stored information "1" an inversion boundary layer is formed at the silicon surface of said capacitor, and in case of said stored information "0" a depletion layer is formed (instant $t_2$) at said silicon surface at said capacitor; and applying a positive voltage pulse (instant $t_3$) to said write line to erase the information stored in said capacitor.

20. A method for the operation of a single-transistor memory element connected to a word line and a bit line and comprising a write line, a transistor, and a capacitor having a silicon surface, connected in series thereto, comprising the steps of:

using a p-channel transistor;

applying a negative voltage to a write line where information in a memory element is stored non-transiently, such that where of an information "0" is stored in said capacitor a shifting of a flat-band voltage occurs and where information "1" is stored the flat-band voltage is held constant; and erasing the information stored in said capacitor after a read-out operation and before a next write-in operation for non-transient storage by applying a positive voltage pulse to the write line.

21. The method as defined in claim 20, wherein the method further comprises the steps of:

applying said negative voltage to write line for said read-out opeation such that for said stored information "0" a depletion layer is formed at the silicon surface of said capacitor and for said stored information "1" an inversion boundary layer is formed at said silicon surface of said capacitor.

22. The method as defined in claim 20, wherein the method further comprises the steps of:

applying said negative voltage to said write line for read-out operation, where said negative voltage applied has an absolute value greater than two values of the flat-band voltages of the capacitors and integrating it such that the surface potential of said inversion boundary layer, in a case of the constant flat-band voltage of the capacitor adjusts itself to the value of the voltage of the write line less the flat-band voltage, and in a case of the shifted flat-band voltage of the capacitor, it adjusts itself to the value of the voltage present at the write line less the value of the shifted flat-band voltage; and directing said integrated voltage of the write line to the bit line by way of said transistor for purposes of read-out.

23. The method as defined in claim 20, wherein the method further comprises the step of applying voltages of opposite polarity in a case of using an n-channel transistor as said transistor.

* * * * *